United States Patent [19]
Lawandy

[11] Patent Number: 5,493,628
[45] Date of Patent: Feb. 20, 1996

[54] HIGH DENSITY OPTICALLY ENCODED INFORMATION STORAGE USING SECOND HARMONIC GENERATION IN SILICATE GLASSES

[76] Inventor: Nabil M. Lawandy, 70 Ogden St., Providence, R.I. 02906

[21] Appl. No.: 236,266

[22] Filed: May 2, 1994

Related U.S. Application Data

[60] Continuation-in-part of Ser. No. 90,818, Jul. 13, 1993, Pat. No. 5,383,038, which is a division of Ser. No. 778,593, Oct. 17, 1991, Pat. No. 5,253,258.

[51] Int. Cl.$^6$ .............................. G02B 6/10; G02B 6/293
[52] U.S. Cl. ...................... 385/122; 385/141; 346/107.1; 359/7; 359/326; 359/328
[58] Field of Search .................... 385/122, 131, 385/141, 142, 144, 129, 130; 346/76 L; 359/7, 326, 328, 332; 372/22, 21, 23

[56] References Cited

U.S. PATENT DOCUMENTS

| | | | |
|---|---|---|---|
| 4,896,933 | 1/1990 | Yano et la. | 385/122 X |
| 4,973,117 | 11/1990 | Yamada | 385/122 X |
| 4,973,118 | 11/1990 | Enomoto et al. | 358/326 |
| 5,130,844 | 7/1992 | Okazaki | 385/122 |
| 5,151,817 | 9/1992 | Krol et la. | 359/328 |
| 5,153,873 | 10/1992 | Spruit et al. | 369/109 |
| 5,224,195 | 6/1993 | Yoshida et al. | 385/122 |
| 5,253,258 | 10/1993 | Lawandy | 385/122 X |
| 5,383,038 | 1/1995 | Lawandy | 359/7 |

*Primary Examiner*—Brian Healy
*Attorney, Agent, or Firm*—Perman & Green

[57] ABSTRACT

Multiple bits of information are stored in the frequency domain in a bulk glass using optically encoded $\chi^{(2)}$ gratings. The information is read out by measuring a second harmonic generation (SHG) from the encoded glass as a function of wavelength. Information storage densities in excess of $10^8$ bits/cm$^2$ are readily achievable. The stored information is stable under readout conditions, and the information can be erased and rewritten.

20 Claims, 3 Drawing Sheets

5,493,628

HIGH DENSITY OPTICALLY ENCODED INFORMATION STORAGE USING SECOND HARMONIC GENERATION IN SILICATE GLASSES

CROSS-REFERENCE TO A RELATED PATENT APPLICATION

This patent application is a continuation-in-part of U.S. patent application Ser. No. 08/090,818, filed Jul. 13, 1993, entitled "Optically Encoded Phase Matched Second Harmonic Generation Device and Self-Frequency Doubling Laser Material Using Semiconductor Microcrystallite Doped Glasses", by Nabil M Lawandy, now U.S. Pat. No. 5,383,038, which is a division of U.S. patent application Ser. No. 07/778,593, filed Oct. 17, 1991, entitled "Optically Encoded Phase Matched Second Harmonic Generation Device and Self-Frequency Doubling Laser Material Using Semiconductor Microcrystallite Doped Glasses", by Nabil M Lawandy, now U.S. Pat. No. 5,253,258, issued Oct. 12, 1993, the disclosure of which is incorporated by reference herein in its' entirety.

FIELD OF THE INVENTION

This invention relates generally to information storage methods and apparatus and, in particular, to optically-based information storage methods and apparatus.

BACKGROUND OF THE INVENTION

Optical information storage, offering the benefits of high storage density and rapid access to stored information, has replaced traditional magnetic storage media for many applications. Various techniques have been developed for the permanent storage of high density optically readable information, such as volume holography and laser disc encoding.

It is an object of this invention to provide an optically-based high density information storage medium that enables multiple information units, such as bits, to be stored within a single small region of a glass body and to be subsequently read-out.

SUMMARY OF THE INVENTION

This invention employs optically encoded second harmonic generation (SHG) in glass. Information is stored in the form of wavelength selective, one-dimensional $\chi^{(2)}$ gratings within the glass, and the information is read out by illuminating an encoded region with light at a selected wavelength, or with light having wavelengths within a predetermined range of wavelengths. It is shown that multiple gratings may be stored within a single region of a glass storage medium, with each grating corresponding to a different wavelength. When the region of the glass is irradiated by light at one of the selected wavelengths, the glass produces a second harmonic generation (SHG) signal which may be five orders of magnitude or more larger than that from a volume of glass which has not been encoded. The gratings are permanent at room temperature but may be erased by heating or by exposure to ultraviolet (UV) radiation.

The teaching of this invention offers the benefit of reading out small amounts of information at a time, as in laser disc technology, and may also provide an increased density of information storage due to the frequency domain encoding of multiple bits of information within a single volume element of a glass-based information storage medium.

In addition, the technique may be employed in a volume holography mode commonly used in photorefractive holographic storage.

BRIEF DESCRIPTION OF THE DRAWINGS

The above set forth and other features of the invention are made more apparent in the ensuing Detailed Description of the Invention when read in conjunction with the attached Drawings, wherein:

FIGS. 6A–6C illustrate an embodiment of a storage medium that employs an array of waveguides, wherein FIG. 6A is an end view of a single waveguide, FIG. 6B is an end view of an array of the waveguides of FIG. 6A, and FIG. 6C is an elevational view of an array of waveguides.

DETAILED DESCRIPTION OF THE INVENTION

FIG. 16 of the above-referenced U.S. Pat. No. 5,253,258 shows a holographic medium that is constructed of glass having semiconductor microcrystallites incorporated therein.

This invention extends the teaching of U.S. Pat. No. 5,253,258 to silicate glasses in general, and also teaches the recording and readout of multiple information units from a single region of a glass.

Certain types of glass optical fibers, when exposed to intense radiation for several hours, have been observed to evolve in time to produce efficient (~3%) SHG. It was also observed that the evolution could be reduced to several minutes by irradiating fibers with both the fundamental and second harmonic optical fields simultaneously. Subsequent irradiation of the fiber with the fundamental field resulted in efficient SHG. The inventor subsequently extended this effect to a bulk glass. In U.S. Pat. No. 5,157,674 the inventor teaches second harmonic generation (SHG) with a bulk glass, such as substitutionally doped silica that may include a charge transfer dopant. The disclosure of U.S. Pat. No. 5,157,674 is incorporated by reference herein in its' entirety, as is the disclosure of U.S. Pat. No. 5,233,621, which is a division of No. 5,157,674.

Although the microscopic mechanism behind this effect is not completely understood, it is believed that the SHG occurs via a periodic dc electric field, which produces SHG using the nonlinear optical coefficient $\chi^{(3)}(-2\omega,0,\omega,\omega)$. The readout wavelength dependence of the SHG from glass encoded by a single frequency pair $(\omega,2\omega)$ is consistent with phase matching by a dc electric field which oscillates as cos ($\Delta kz$), where $\Delta k=k(2\omega)-2k(\omega)$ is the wavevector mismatch between the fundamental and second harmonic beams, and z is the beam propagation direction. The readout wavelength dependence of SHG from a sample encoded with free-space wavelengths $\lambda_0$ and $\lambda_{0/2}$ is given by $$I_{SH}(\lambda/2) \sim L^2 \text{sinc}^2\{[\Delta k(\lambda-\Delta k(\lambda_0)]L/2\}, \quad (1)$$

where $I_{SH}(\lambda/2)$ is the intensity of the second harmonic radiation at the free-space wavelength $\lambda/2$, L is the grating length, $$\Delta k(\lambda)=k(\lambda/2)-2k(\lambda)=4\pi[n(\lambda/2)-n(\lambda)]/\lambda,$$

and $n(\lambda)$ is the index of refraction of the glass at $\lambda$. Thus, the SHG spectrum generated by scanning the readout wavelength, $\lambda$, through the encoding wavelength, $\lambda_0$, will show a dominant peak at $\lambda_0$.

The principle of multiple wavelength encoding employs the narrow SHG response linewidth due to phase matching described by eq. (1). For long gratings and highly dispersive glass the SHG readout spectrum can be as narrow as a fraction of an Angstrom.

Figure 1:
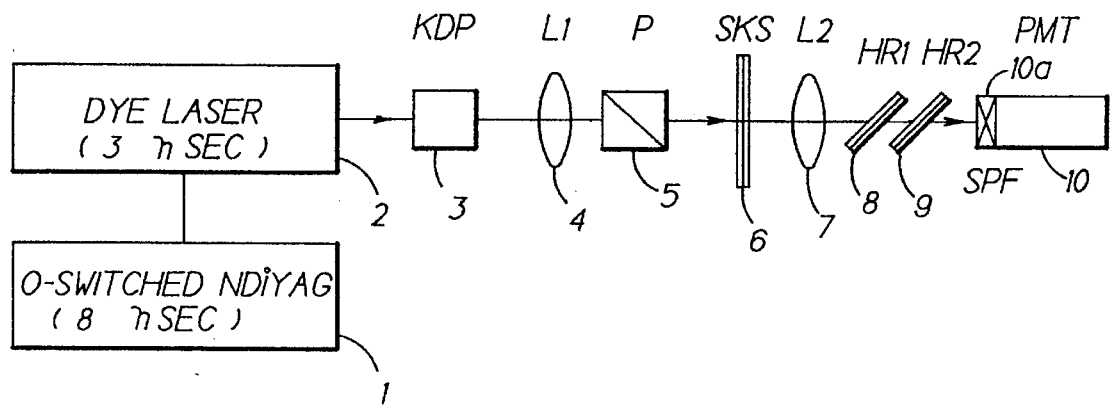
FIG. 1 is a block diagram of an information storage and retrieval system that is suitable for practicing this invention.
Figure 3:
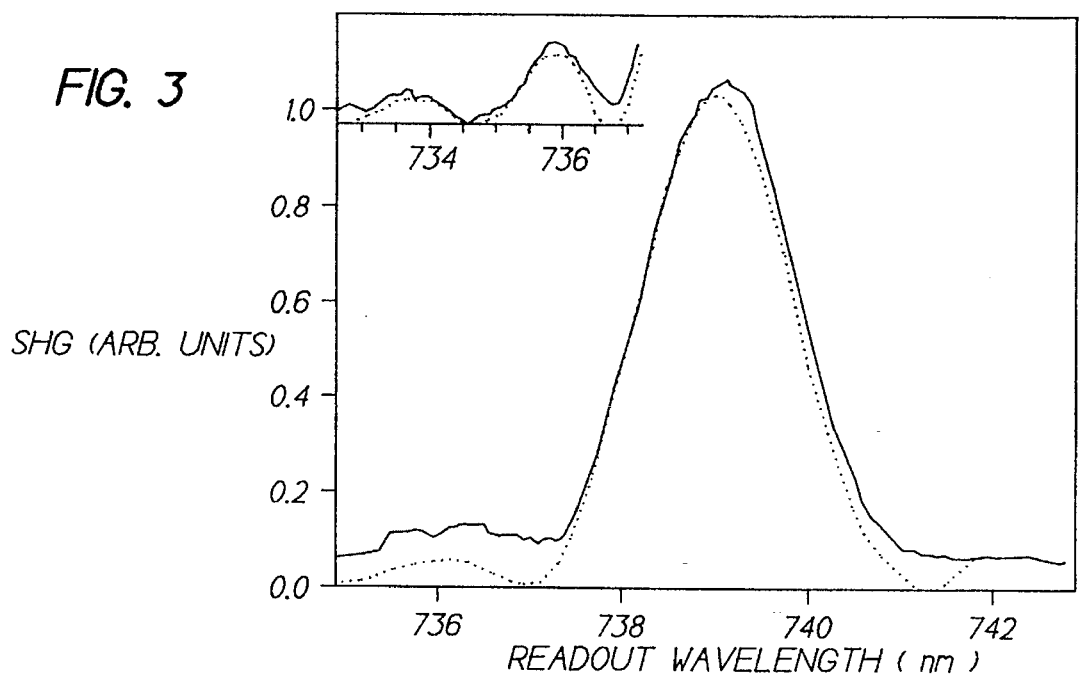
FIG. 3 is a graph that depicts the dependence of SHG on the read-out wavelength.

FIG. 3 shows the SHG generated by tuning the readout wavelength in a 1.5 mm thick sample of SK5 glass (Schott Glass Co.) that was encoded using the apparatus illustrated in FIG. 1 with peak intensities of 10 GW/cm$^2$ and 50 kW/cm$^2$ at the fundamental ($\lambda$=739 nm) and second harmonic ($\lambda$=368.5 nm) wavelengths, respectively. The solid line (designated A) is the measured SHG from a spot or region that was encoded for 20 minutes with a fundamental wavelength of 739 nm. The dashed line (designated B) is the SHG predicted from equation 1 using the known dispersion of SK5 glass and a grating length equal to the sample length (1.5 mm). The inset in FIG. 3 shows the measured and theoretical first two side lobes on the short wavelength side of the central peak, with the dc offset removed. The readout spectrum was found to be 20Å wide for a 1.5 mm thick sample. Thus, if the gratings are encoded at 6 Å intervals in a 10 mm thick piece of SK5 glass, the individual SHG peaks are resolvable, and each peak can serve to indicate the presence or absence of one bit of information. Many bits of information can be stored in one spot or region by sequentially encoding the single region with wavelength pairs ($\lambda_j$, $\lambda_j/2$). This process results in the formation of a plurality of gratings superimposed upon one another within the single region, so long as the later encoding steps do not completely erase the earlier ones.

Each wavelength pair can also be angle multiplexed to store even more information within a given region or domain of the medium 6. By example, within each region of glass one bit may be defined as ($\lambda_j$, $\lambda_{j/2}$, $\theta_j$). That is, the bit is defined by the fundamental and second harmonics and also by the angle $\theta$ by which the bit was recorded. The space in between angles ($\theta_{j1}$ and $\theta_{j2}$) should be large enough to make ($k_{2\omega}-2k_\omega$) [cos $\theta_{j1}$ −cos $\theta_{j2}$]≧$\pi$, in the same way that changing $\lambda$ moves the response according to equation (1).

When the readout wavelength, $\lambda$, is scanned across the range of encoded wavelengths, externally detectable SHG signals are generated within the encoded region only where $\lambda=\lambda_j$. As will be shown below, as many as ten gratings have been encoded within one 140 μm by 140 μm area of bulk glass.

As illustrated in FIG. 1, samples were encoded at multiple wavelengths by light from a tunable source, specifically a pulsed (20 Hz) dye laser 2 that was driven by a Q-switched Nd:YAG laser 1. By example, the dye laser 2 was a Continuum ND60 having an output in the 680–780 nm range and a 3 ns pulse width. The fundamental beam was frequency doubled in, by example, a KDP crystal 3, and the resulting bichromatic beam was focussed and linearly polarized 4, 5 onto the glass information storage medium 6. Encoding times were typically of the order of 1 minute (1200 shots from the dye laser 2). The encoded spot was read out by tilting the KDP crystal 3 to prevent phase matching in the crystal and inserting a long pass filter (Schott GG455) before the medium 6. The SHG from the medium 6 was detected using a lens 7, two high reflectors 8 and 9 at the fundamental wavelength, and several short pass filters 10a before a photomultiplier tube (PMT 10). The PMT output was sent to a lock-in amplifier (not shown) and phase detected at the 20 Hz dye laser reference signal. In FIG. 1 both L1 and L2 are 25 cm focal length lenses.

While several types of glass were successfully encoded for SHG using the apparatus depicted in FIG. 1 (e.g. Ge-doped $SiO_2$, borosilicate glasses, Al-doped $SiO_2$, lead oxide glass, and semiconductor doped glasses), the following description is made in the context of commercially available SK5 glass (Schott Glass Co.). This is a high barium content (~40% BaO) borosilicate glass, which was first observed to encode for SHG using 1064 nm and 532 nm wavelengths. The absorption in this glass sets in for $\lambda \approx 330$ nm. As a result, it is highly dispersive at the second harmonic wavelengths used in encoding the information. Although relatively large peak intensities are required to encode the information in SK5 glass, lower encoding intensities are believed to be possible by pre-treating the glass with UV radiation.

Using the apparatus shown in FIG. 1 there were encoded $\chi^{(2)}$ gratings at nine different fundamental wavelengths in the range from 729 nm to 747 nm. Encoding times for earlier encoded gratings were made longer than for later encoded gratings to compensate for the partial erasure during encoding.

Figure 4:
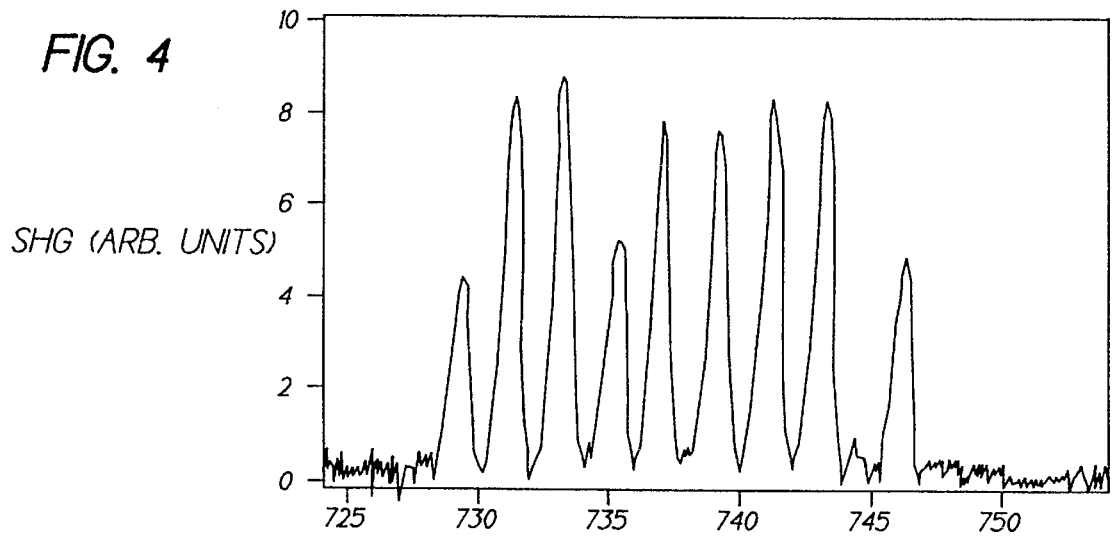
FIG. 4 is a graph illustrating nine bits of information encoded into one volume of the holographic medium of FIG. 2.

FIG. 4 shows the SHG produced when the readout wavelength was scanned across the encoded wavelength range (729 nm–747 nm). The SHG produced a clear signal with easily resolvable peaks at each of the encoded wavelengths, demonstrating that multiple wavelength $\chi^{(2)}$ encoding in the same volume of the medium 6 is occurring.

It is important to note that if the irradiating source is a broad band source (e.g., 720–737 nm from superradiant emission or chirping of the readout pulse), all encoded bits produce SHG simultaneously. The stored information may then be read-out in parallel by spectrally separating the output light, such as by providing a suitable grating, and then sending the spectrally separated light onto an array of properly located detectors.

Figure 2A:
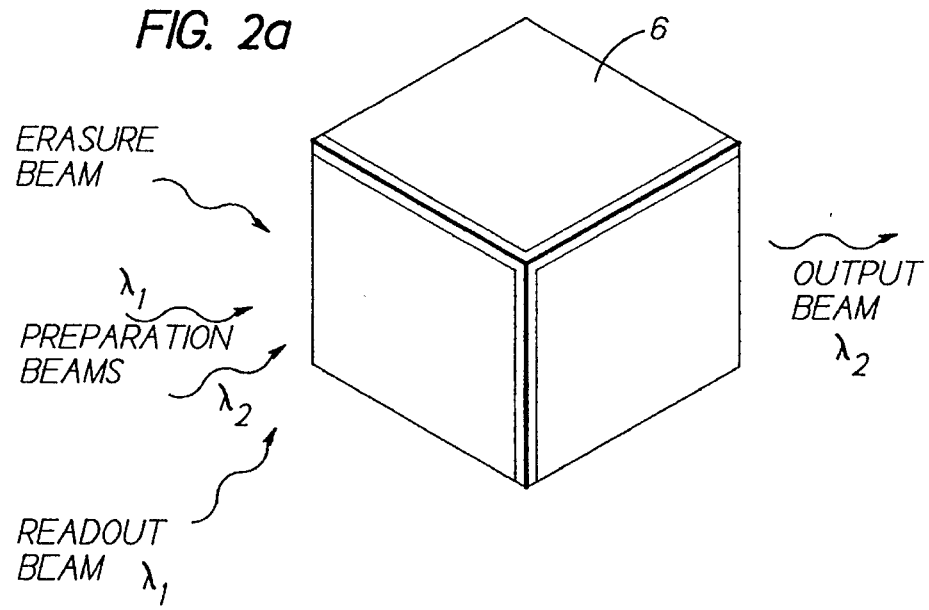
FIG. 2a illustrates a holographic medium that is constructed and operated in accordance with the invention.
Figure 2B:
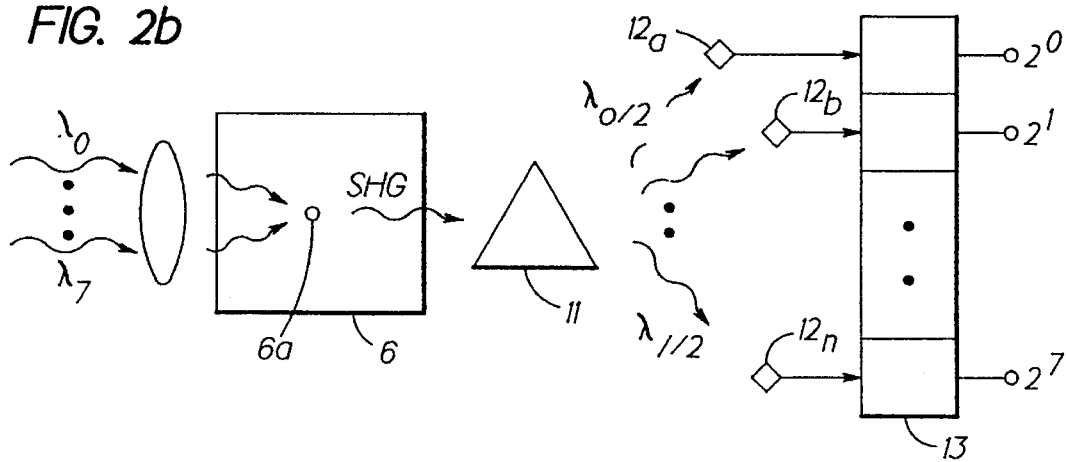
FIG. 2b illustrates a holographic medium and associated components that enable multiple bits to be simultaneously read-out and detected.

As an example, and referring to FIG. 2b, it is assumed that eight fundamental wavelengths ($\lambda_0$ through $\lambda_7$) and the corresponding second harmonics ($\lambda_0/2$ through $\lambda_7/2$) are employed to write one byte (8 bits-$2^0$ to $2^7$) of data into one region 6a of the medium 6. In this example wavelength $\lambda_0$ corresponds to the least significant bit (LSB) and wavelength $\lambda_7$ corresponds to the most significant bit (MSB). A logic one at a given bit position is encoded by applying the corresponding fundamental and second harmonic, while a logic zero is encoded by not applying the corresponding fundamental and second harmonic, thereby not writing a grating for the wavelength pair. When this region is subsequently read out, either by sequentially applying the fundamental wavelengths ($\lambda_0$ through $\lambda_7$) or by simultaneously applying the fundamental wavelengths, the presence or absence of SHG for each of the fundamental wavelengths indicates the value of the byte. For example, if SHG is detected for only the fundamental wavelengths $\lambda_7$, $\lambda_5$, $\lambda_1$, and $l_0$, then the corresponding value of the stored byte is 10100011, or $A3_{16}$. A grating 11 can be employed to spectrally separate the SHG wavelengths into eight channels, each of which has an associated detector 12 and amplifiers. The output of each channel is applied to an output register 13 wherefrom a plurality of bits, in this case eight, can be read in parallel. Encoding and reading out different regions can be accomplished by physically translating the medium 6 with respect to the input beam(s), or can be accomplished by keeping the medium stationary and scanning the input beam(s) to a selected region. It is also within the scope of the invention to provide a single detector 12, and to translate the grating 11, or some other suitable wavelength separation means, so as to scan the SHG wavelengths over the single detector. In this case the readout of the detector 12 is preferably synchronized with the scanning of the grating 11.

FIG. 4 illustrates the presence of nine bits of information that are encoded into one small volume or spot of the glass medium 6. The spot was encoded in a 10 mm thick sample at 9 different fundamental wavelengths ranging from 729.5nm to 746.5nm, and their corresponding second harmonics. To produce relatively uniform SHG readings the encoding times were decreased from 120 seconds for the first wavelength to 30 seconds for the final wavelength.

The SHG was measured using a lock-in amplifier to extract the signal from the detector (PMT). For high speed applications, however, this is not a preferred means of reading the information due to the long averaging time of the lock-in amplifier (~100 ms). A more rapid readout mechanism employs a single 3 ns long (15 J/cm²) laser pulse and sends the PMT output directly to a detector, such as an oscilloscope. The resulting signal exhibited a decay time of ~300 µs, due to the RC time constant of the oscilloscope. The measured voltage decreased by several orders of magnitude as the medium 6 was moved off the encoded spot, demonstrating that a single nanosecond wide pulse may be used to read out the encoded information. For achieving even faster readout rates a mode locked laser (e.g. Ti:sapphire with ~100 MHz repetition rate, or GaAs diode laser) may be employed, which provides detector-limited readout rates.

Another important property for high density information storage applications is an ability to store information within nearby spots or regions. The size of the encoded spot was determined by translating the medium 6 perpendicular to the beam and measuring the resulting SHG. This showed that the encoded spot was 140 µm wide (fwhm).

To illustrate the high density encoding that is made possible by the teaching of this invention, a 5 cm focal length lens was employed to encode three neighboring spots separated from one another by 12 µm. The resulting SHG profile, shown in FIG. 5, demonstrates that this close spacing is sufficient to resolve the SHG peaks. When these small spots were scanned in a λ-space, however, the peaks were found to be 70 Å wide. This is due to the small Rayleigh length of the focussed beam. Thus, there is a trade-off between spot size and grating length.

Figure 5:
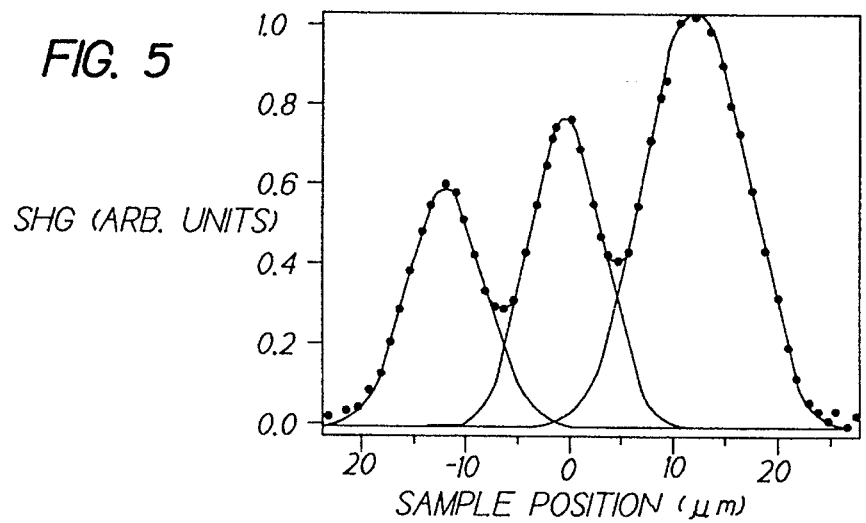
FIG. 5 shows the effect of encoding at nearby locations.

More particularly, in FIG. 5 three spots were encoded in the 1.5 mm thick medium 6 with a fundamental wavelength of 729 nm and the corresponding second harmonic. The encoding beam was focussed with a 5 cm focal length lens, and each spot was encoded for 15 minutes. The resulting SHG was measured at the encoding wavelength as a function of sample position relative to the position of encoding for the central spot. The dots in FIG. 5 correspond to measured SHG values, and the lines are fits to gaussian profiles expected for a translated sample.

For a gaussian beam focussed to a waist of radius $w_0$, the Rayleigh length is $z_0=\pi w_0^2 n/\lambda$, so the maximum grating length is $L=2z_0=2\pi w_0^2 n/\lambda$, where n is the index of refraction at the free-space wavelength λ. When two gratings are written so that their first nulls in frequency space overlap, their wavevector mismatches satisfy $(\Delta k_1 L - \Delta k_2 L)/2 = 2\pi$. This gives a minimum beam waist of $$w_0/2 = (2\pi n \delta \Delta n)^{-1/2}, \quad (2)$$

where
$\delta \Delta n = [n(\lambda_1/2) - n(\lambda_1)] - [n(\lambda_2/2) - n(\lambda_2)] \approx \delta\lambda(\frac{1}{2}dn/d\lambda|_{\lambda=\lambda_1/2} - dn/d\lambda|_{\lambda=\lambda_1})$,
and $\delta\lambda = \lambda_1 - \lambda_2$ is the wavelength separation between fundamental encoding beams. For a given fundamental tuning range $\Delta\lambda$ and a minimum separation between peaks $\delta\lambda$, the maximum number of bits stored in one spot is $I=\Delta\lambda/\delta\lambda$, and the resulting information density is given by $$\frac{I}{\pi W_0^2} = \frac{2n\Delta\lambda}{\lambda^2} \left( \frac{1}{2} \left. \frac{dn}{d\lambda} \right|_{\lambda=\lambda_0/2} - \left. \frac{dn}{d\lambda} \right|_{\lambda=\lambda_0} \right) \quad (3)$$

This result is independent of spot size, since spot area and information per spot both scale inversely with $\delta\lambda$. Using SK5 glass and a fundamental tuning range of 350 nm around $\lambda_0=720$ nm, eq. (3) yields an information density of $2\times10^7$ bits/cm². This density can be increased considerably with an appropriate choice of glass. For example, the dispersion of SK5 glass leads to $n\delta\Delta n/\delta\lambda = 1.3\times10^{-4}$ nm$^{-1}$ at $\lambda_0=720$ nm, whereas in SF57 glass (Schott Glass Co.) $n\delta\lambda n/\delta\lambda = 1.1\times10^{-3}$ nm$^{-1}$ at $\lambda_0=720$ nm, resulting in an information density of the order of $10^8$ bits/cm². This latter value is comparable to the information density on a conventional laser disc.

Figure 6A:
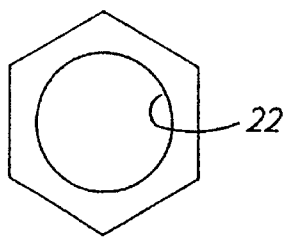
Figure 6B:
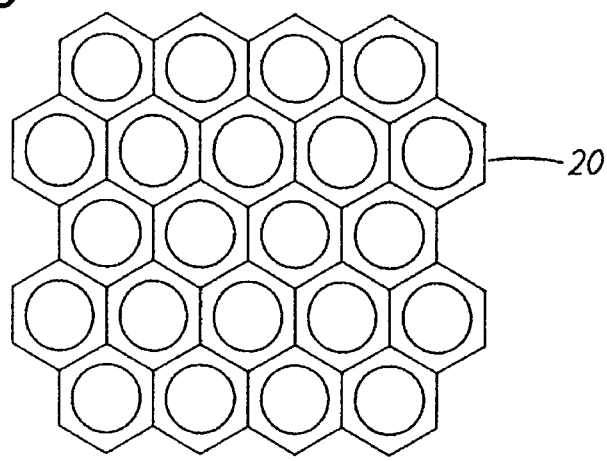
Figure 6C:
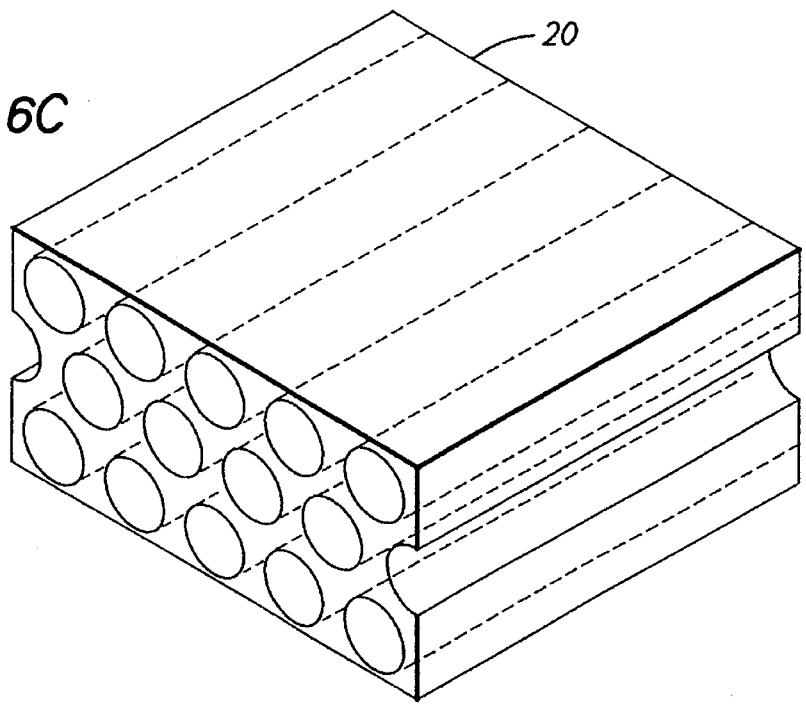

The trade off described above can be circumvented by the use of guided waves which do not spread due to diffraction. As an example, and referring to FIGS. 6A–6C, a hexagonal array of waveguides 20 is employed to contain the second harmonic generated light. This allows for an equivalent density in wavelength space while maintaining a high density in physical area space. As an example, the array 20 is a nanochannel glass array comprised of a plurality of parallel aligned guiding/storage tubes 22. The tubes 22 may be comprised of, by example, lead glass or a semiconductor that is filled by capillary action. The end area of each tube has spatial dimensions that are on the order of those described above.

A further property that is useful for many applications is the capability to erase and rewrite information. At least two mechanisms for removing optically encoded information are thermal and optical erasure. Thermal erasure of optically encoded gratings has been demonstrated, and it is found that a grating can be completely erased in approximately two minutes by heating the medium 6 to 400° C. For more controlled information removal, optical erasure can be used. This process requires short wavelengths (λ<500 nm in most glasses), so the UV used to encode is ideal for this purpose. To demonstrate this effect four bits of information were encoded on one spot, and 20 W/cm² average power at λ=365 nm was used to erase the grating. After five minutes of erasure the SHG signal was down to 10% of its initial value, and after 30 minutes the erasure was complete. The four bits were subsequently re-encoded at the same spot to the original level.

In conclusion, it has been demonstrated that a low cost, durable glass can be used to store many bits of information in micron-sized areas. Information densities in excess of $10^8$ bits/cm² are made possible using the technique of this invention, and the information can be read out sequentially or in parallel. The signals are sufficiently strong to be detected by a single, nanosecond laser pulse thereby providing rapid access to the stored data. In addition, the information can be erased and rewritten either word by word, or by a bulk erasure procedure. The glass-based medium is durable and much more immune to environmental effects than conventional information storage mediums. Furthermore, the recorded information is believed to have a lifetime in excess of $10^3$ years at room temperature. A further feature of this invention is that readout data rates of 100 Gb/sec or greater are achievable when operating in the parallel mode. Furthermore, there is no interference between the signal and readout beams, thereby increasing the signal-to-noise ratio.

Although described in the context of specific materials, wavelengths, encoding times, and other specified parameters, the teaching of this invention is not to be construed to be limited to any of these specific materials or values. For example, the use of the polarizer 5 is optional. Also by example, the KDP crystal 3 can be replaced by second harmonic generators that are constructed in accordance with the teachings of the above-referenced U.S. Pat. Nos. 5,253,258, 5,157,674 or 5,233,621.

Thus, while the invention has been particularly shown and described with respect to preferred embodiments thereof, it will be understood by those skilled in the art that changes in form and details may be made therein without departing from the scope and spirit of the invention.

What is claimed is:

1. An information storage medium comprising a body having a plurality of regions each of which is capable of being encoded with multiple units of information, each of said regions of said body being responsive to electromagnetic radiation having at least one first wavelength for outputting electromagnetic radiation at a second wavelength that is shorter than the first wavelength for indicating a presence of at least one stored encoded unit of information.

2. An information storage medium as set forth in claim 1 wherein said body is comprised of glass.

3. An information storage medium as set forth in claim 2 wherein the glass is comprised of lead oxide glass.

4. An information storage medium as set forth in claim 2 wherein the glass is comprised of borosilicate glass.

5. An information storage medium as set forth in claim 2 wherein the glass is comprised of Ge-doped $SiO_2$.

6. An information storage medium as set forth in claim 2 wherein the glass is comprised of Al-doped $SiO_2$.

7. A method for storing information, comprising the steps of:

providing a storage medium that is comprised of glass;

storing a first unit of information within a predetermined region of the medium by simultaneously applying a first wavelength and a second wavelength that is one half of the first wavelength; and storing a second unit of information within the same predetermined region of the medium by simultaneously applying a third wavelength and a fourth wavelength that is one half of the third wavelength.

8. A method as set forth in claim 7 and further comprising the steps of:

reading out the first information unit by applying the first wavelength to the predetermined region and detecting the presence of the second wavelength that is output from the predetermined region; and reading out the second information unit by applying the third wavelength to the predetermined region and detecting the presence of the fourth wavelength that is output from the predetermined region.

9. A method as set forth in claim 8 wherein the steps of reading out are accomplished by scanning a wavelength source through a wavelength region that includes the first and third wavelengths and sequentially reading out the information units.

10. A method as set forth in claim 8 wherein the steps of reading out are accomplished by operating a wavelength source that simultaneously outputs the first and the third wavelengths and simultaneously reading out the information units.

11. A method as set forth in claim 10 and further including the steps of:

spectrally separating the second and fourth wavelengths one from another; and separately detecting the presence of the second and the fourth wavelengths.

12. A method as set forth in claim 7 wherein the first and second wavelengths are applied for a first period of time, and wherein the third and fourth wavelengths are applied for a second period of time that is shorted than the first period of time.

13. A method for storing data within a storage medium, comprising the steps of:

providing an n-bit data word, where n is equal to or greater than one;

providing an optical source capable of outputting n different wavelengths and the second harmonic of each of the n different wavelengths;

selectively writing or not writing a $\chi^{(2)}$ grating within a region of a glass-based medium for each bit of the n-bit word as a function of a value of each bit, the step of writing, for a given one of the bits, including a step of simultaneously applying to the region at least one of the predetermined ones of the n wavelengths and the second harmonic; and subsequently reading-out the n-bit data word from the glass-based medium by the steps of applying the n different wavelengths to the predetermined region and detecting the presence of corresponding ones, if any, of the second harmonics that are generated by an associated $\chi^{(2)}$ grating within the region in response to the application of the n different wavelengths.

14. A method as set forth in claim 13 wherein the step of applying the n different wavelengths applies the wavelengths sequentially.

15. A method as set forth in claim 13 wherein the step of applying the n different wavelengths applies the wavelengths simultaneously.

16. A method for reading information from an information storage medium, comprising the steps of:

illuminating a region of the information storage medium with electromagnetic radiation having n fundamental wavelengths, where n is equal to or greater than one; and detecting up to n second harmonic wavelengths that are generated within the illuminated region in response to the step of illuminating, each detected second harmonic wavelength representing information that is stored within the storage medium.

17. A method as set forth in claim 16 wherein the step of illuminating the region occurs at a first angle, and further including the steps of:

illuminating the region of the storage medium at a second angle with the electromagnetic radiation having n fundamental wavelengths; and detecting up to n second harmonic wavelengths that are generated within the illuminated region, each detected second harmonic wavelength representing information that is stored within the storage medium.

18. An information storage medium as set forth in claim 1 wherein said body is contained with a structure for guiding at least the outputted electromagnetic radiation having the second wavelength.

19. A structure for storing information, comprising:

a plurality of waveguides individual ones of which contain a material which is capable of being encoded at a plurality of regions with multiple units of information, each of said regions of said material being responsive to electromagnetic radiation having at least one first wavelength for outputting electromagnetic radiation at a second wavelength that is shorter than the first wavelength for indicating encoded information, wherein at least the outputted electromagnetic radiation having the second wavelength is guided by the waveguide that contains the material.

20. A structure as set forth in claim 19 wherein said structure is comprised of an array of parallel aligned tubular structures individual ones of which are comprised of glass.

* * * * *